United States Patent
Seddon et al.

(10) Patent No.: US 9,893,058 B2
(45) Date of Patent: Feb. 13, 2018

(54) METHOD OF MANUFACTURING A SEMICONDUCTOR DEVICE HAVING REDUCED ON-STATE RESISTANCE AND STRUCTURE

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/208,794

(22) Filed: Jul. 13, 2016

(65) Prior Publication Data
US 2017/0110452 A1   Apr. 20, 2017

Related U.S. Application Data

(60) Provisional application No. 62/219,666, filed on Sep. 17, 2015.

(51) Int. Cl.
| | |
|---|---|
| *H01L 27/088* | (2006.01) |
| *H01L 23/48* | (2006.01) |
| *H01L 27/14* | (2006.01) |
| *H01L 21/78* | (2006.01) |
| *H01L 21/308* | (2006.01) |
| *H01L 21/288* | (2006.01) |
| *H01L 21/3065* | (2006.01) |

(Continued)

(52) U.S. Cl.
CPC .......... *H01L 27/088* (2013.01); *H01L 21/288* (2013.01); *H01L 21/308* (2013.01);
(Continued)

(58) Field of Classification Search
CPC . H01L 27/088; H01L 21/3065; H01L 21/288; H01L 21/308; H01L 21/76877;
(Continued)

(56) References Cited

U.S. PATENT DOCUMENTS

| | | | | |
|---|---|---|---|---|
| 3,462,650 A | * | 8/1969 | Schutze | .................. H01L 21/00 |
| | | | | 148/DIG. 122 |
| 3,761,782 A | * | 9/1973 | Youmans | .............. H01L 21/764 |
| | | | | 148/DIG. 115 |

(Continued)

FOREIGN PATENT DOCUMENTS

| | | |
|---|---|---|
| JP | 2002076326 A | 3/2002 |
| JP | 2002368218 A | 12/2002 |

(Continued)

*Primary Examiner* — Nathan W Ha
(74) *Attorney, Agent, or Firm* — Kevin B. Jackson

(57) ABSTRACT

A semiconductor device includes a singulated region of semiconductor material having a first major surface and a second major surface opposite to the first major surface. In one embodiment, the second major surface includes a recessed surface portion bounded by opposing sidewall portions extending outward from the region of semiconductor material in cross-sectional view. The sidewall portions have outer surfaces defining peripheral edge segments of the singulated region of semiconductor material. An active device region is disposed adjacent to the first major surface and a first conductive layer is disposed adjoining the recessed surface portion. The recessed surface portion provides a semiconductor device having improved electrical characteristics, and the sidewall portions provide a semiconductor device that is less susceptible to warpage, breakage, and other reliability issues.

20 Claims, 6 Drawing Sheets

(51) Int. Cl.
*H01L 29/08* (2006.01)
*H01L 27/02* (2006.01)
*H01L 21/683* (2006.01)
*H01L 21/768* (2006.01)

(52) U.S. Cl.
CPC ...... *H01L 21/3065* (2013.01); *H01L 21/6835* (2013.01); *H01L 21/76877* (2013.01); *H01L 21/76898* (2013.01); *H01L 21/78* (2013.01); *H01L 23/481* (2013.01); *H01L 27/0207* (2013.01); *H01L 27/14* (2013.01); *H01L 29/0847* (2013.01); *H01L 2221/68327* (2013.01); *H01L 2224/0401* (2013.01); *H01L 2224/05083* (2013.01); *H01L 2224/05084* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05172* (2013.01); *H01L 2224/05184* (2013.01); *H01L 2224/13025* (2013.01); *H01L 2224/13111* (2013.01); *H01L 2224/13116* (2013.01); *H01L 2924/13055* (2013.01); *H01L 2924/13091* (2013.01)

(58) Field of Classification Search
CPC ............. H01L 21/76898; H01L 23/481; H01L 29/0847
See application file for complete search history.

(56) References Cited

U.S. PATENT DOCUMENTS

| | | | | |
|---|---|---|---|---|
| 5,274,265 A * | 12/1993 | Tsuruta | ............... | H01L 29/0657 257/565 |
| 5,343,071 A * | 8/1994 | Kazior | ............... | H01L 21/76898 257/621 |
| 5,360,984 A * | 11/1994 | Kirihata | ............... | H01L 27/0617 257/139 |
| 5,420,458 A * | 5/1995 | Shimoji | ............ | H01L 21/76264 257/296 |
| 5,629,535 A * | 5/1997 | Ajit | ...................... | H01L 29/7455 257/120 |
| 5,841,197 A * | 11/1998 | Adamic, Jr. | ........ | H01L 21/2007 257/500 |
| 6,034,415 A * | 3/2000 | Johnson | ............ | H01L 21/76898 257/621 |
| 6,104,062 A * | 8/2000 | Zeng | ................... | H01L 23/4827 257/242 |
| 6,111,280 A * | 8/2000 | Gardner | ............... | G01N 27/128 257/253 |
| 6,124,179 A * | 9/2000 | Adamic, Jr. | ........ | H01L 21/2007 257/E21.564 |
| 7,227,242 B1 * | 6/2007 | Lin | ..................... | H01L 27/0921 257/618 |
| 7,230,314 B2 * | 6/2007 | Udrea | ..................... | H01L 21/84 257/502 |
| 7,235,439 B2 * | 6/2007 | Udrea | .................. | H01L 29/7816 257/E21.383 |
| 7,960,800 B2 * | 6/2011 | Gruenhagen | ..... | H01L 23/49513 257/401 |
| 8,058,732 B2 * | 11/2011 | Gruenhagen | ....... | H01L 23/3114 257/698 |
| 9,012,810 B2 * | 4/2015 | Santoruvo | ............ | B01J 19/0093 219/209 |
| 2016/0197149 A1 * | 7/2016 | Sakai | ................ | H01L 29/66068 257/77 |

FOREIGN PATENT DOCUMENTS

| | | |
|---|---|---|
| JP | 2003243356 A | 8/2003 |
| JP | 2004281551 A | 10/2004 |
| JP | 2007208074 A | 8/2007 |
| JP | 2010205761 A | 9/2010 |

\* cited by examiner

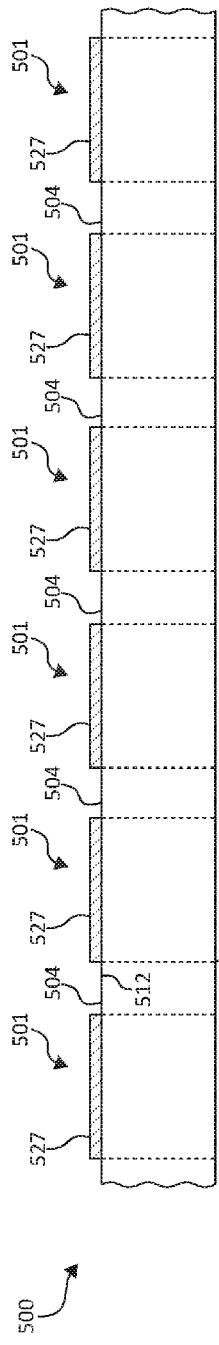
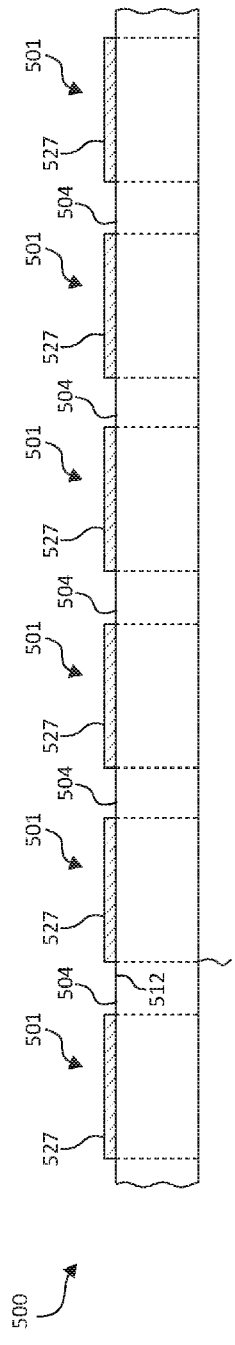
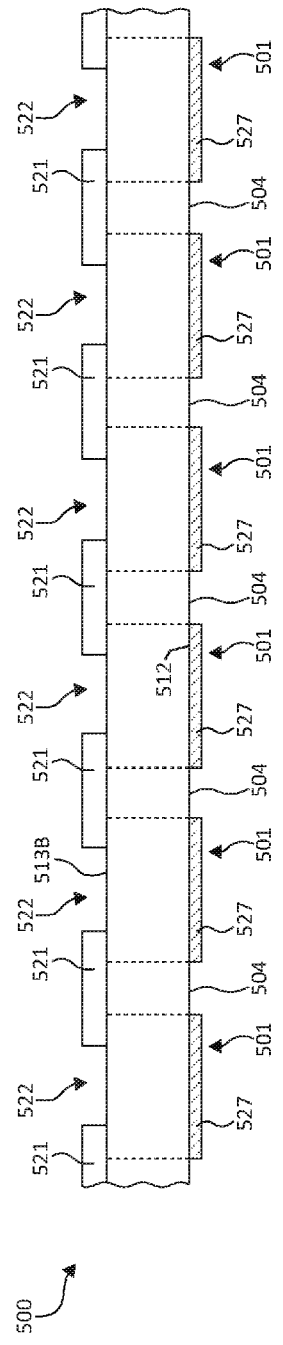

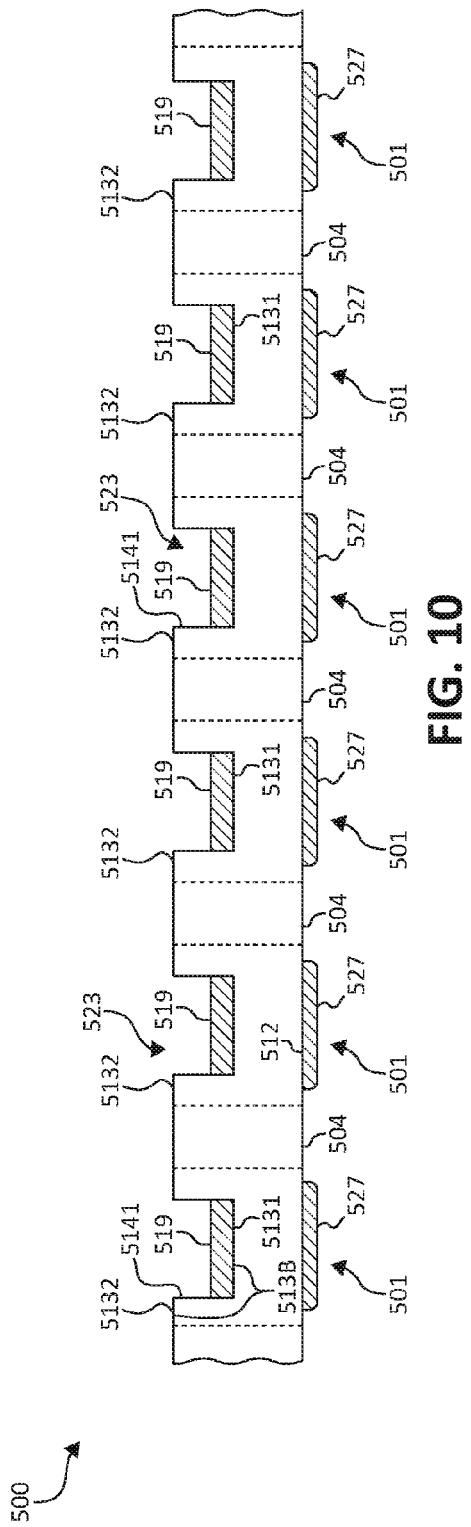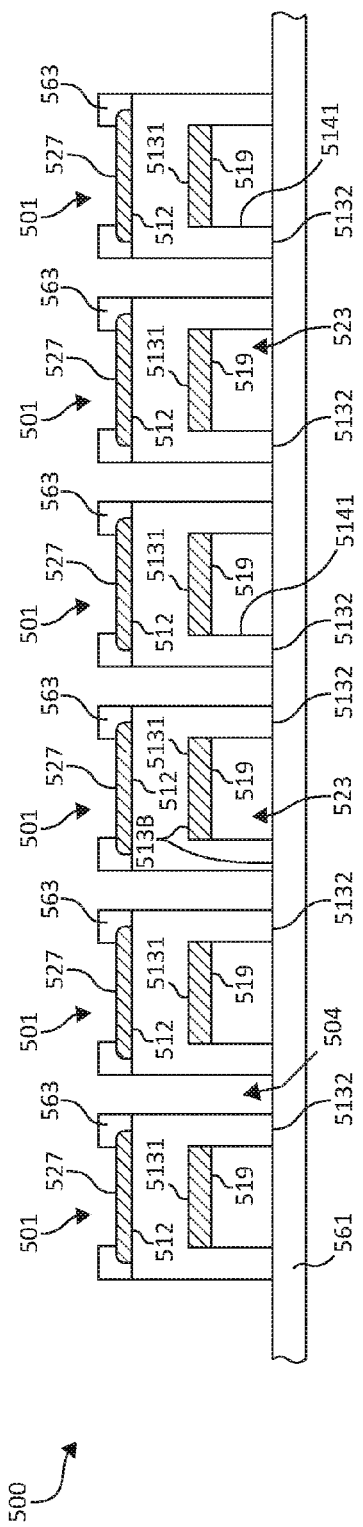

METHOD OF MANUFACTURING A SEMICONDUCTOR DEVICE HAVING REDUCED ON-STATE RESISTANCE AND STRUCTURE

CROSS-REFERENCE TO RELATED APPLICATIONS

This application claims priority to U.S. Provisional Application No. 62/219,666 filed on Sep. 17, 2015, the content of which is hereby incorporated by reference.

BACKGROUND

The present invention relates, in general, to electronics and, more particularly, to semiconductor device structures and methods of manufacture.

Metal-oxide semiconductor field effect transistors (MOSFETs) are a common type of power switching device widely used in industry. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source region and the drain region. In the on state, on-state resistance (Rdson) is an important performance parameter, and in the off state, breakdown voltage (BVdss) is an important performance parameter.

As an example application, MOSFETs are placed proximate to a battery within a cell phone to control the flow of power to the cell phone system. In order to support increased battery life, industry has requested MOSFET devices having reduced Rdson because Rdson is one factor that directly impacts overall battery life. In the past, manufacturers have tried to globally decrease the thickness of semiconductor wafers used to make MOSFET devices. However, the global thinning of the semiconductor wafers has resulted in wafer warpage and/or breakage, which directly impacted manufacturability and reliability of the semiconductor devices. Manufacturability has been further impacted by industry requirements for thicker back metal (e.g., greater than about 1 micron), which together with the thinner wafers has amplified the warpage problem. Thus, manufacturers have had to use thicker MOSFET devices to overcome these manufacturing issues at the expense of Rdson performance.

Accordingly, it is desirable to have a method and structure for improving on-state resistance (Rdson) performance without significantly compromising the structural integrity of semiconductor wafers as well as the manufactured semiconductor die included therein. Also, it would be beneficial if the method and structure could be integrated into existing process flows without significantly impacting manufacturing costs and cycle time.

BRIEF DESCRIPTION OF THE DRAWINGS

FIGS. 5-11 illustrate partial cross-sectional views of a semiconductor wafer having a plurality of semiconductor devices in accordance with a method of the present invention at various stages of fabrication;

Figure 1:
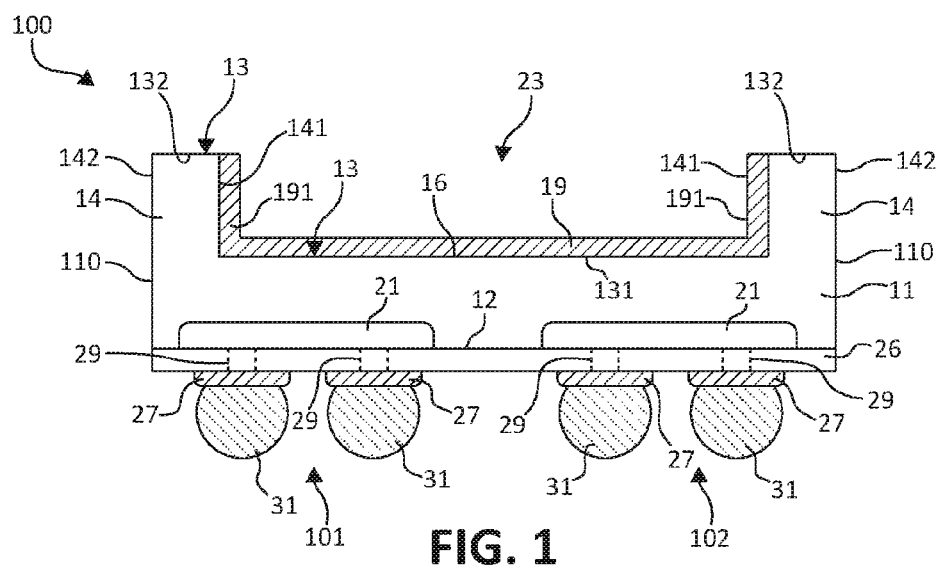
FIG. 1 illustrates an enlarged cross-sectional view of a singulated semiconductor device in accordance with an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action, but that there may be some small but reasonable delay, such as propagation delay, between the reaction that is initiated by the initial action. Additionally, the term while means a certain action occurs at least within some portion of a duration of the initiating action. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. The use of word about, approximately or substantially means a value of an element is expected to be close to a stated value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a semiconductor device having a recessed portion disposed in a major surface opposite to the location of active device regions. The recessed portion is bounded by sidewall portions that extend outward from the recessed portion. A conductive material is disposed within the recessed portion. The recessed portion is configured to provide the semiconductor device with improved electrical performance and the sidewall portions are configured to provide a stronger semiconductor device, which is less susceptible to stress related reliability issues, such as warpage and/or breakage even in the presence of thicker back metal layers.

More particularly, in one embodiment a semiconductor device comprises a singulated region of semiconductor material having a first major surface and a second major surface opposite to the first major surface, the second major surface comprising a recessed surface portion bounded by opposing sidewall portions extending outward from the singulated region of semiconductor material in cross-sectional view, the sidewall portions having outer surfaces defining peripheral edge segments of the singulated region of semiconductor material, the sidewall portions further comprising inner surfaces opposite to the outer surfaces. An active device region is disposed adjacent to the first major surface. In another embodiment, a first conductive layer can be disposed adjoining the recessed surface portion.

In a further embodiment, a method of manufacturing a semiconductor device comprises providing a semiconductor substrate having first and second opposing major surfaces, a plurality of semiconductor devices formed as part of the semiconductor substrate adjacent the first major surface. The method includes forming a plurality of recessed surface portions extending inward from the second major surface, each recessed surface portion disposed adjacent a semiconductor device, each recessed surface portion being bounded by sidewall portions that separate adjacent recessed surfaces, each sidewall portion extending outward from a recessed surface portion. The method includes providing a first conductive layer within each recessed surface portion and singulating the semiconductor substrate through the sidewall portions to provide a plurality of singulated semiconductor devices.

In a still further embodiment, a method for forming a semiconductor device comprises providing a semiconductor substrate having first and second opposing major surfaces, a plurality of power semiconductor devices formed as part of the semiconductor substrate adjacent the first major surface. The method includes forming a plurality of recessed surface portions extending inward from the second major surface, each recessed surface portion disposed adjacent a power semiconductor device, each recessed surface portion being bounded by sidewall portions that separate adjacent recessed surface portions, each sidewall portion extending outward from a recessed surface portion. The method includes providing a first conductive layer within each recessed surface portion. The method includes placing the semiconductor substrate adjacent a carrier substrate and plasma etching the semiconductor substrate from the first major surface through the sidewall portions to provide a plurality of singulated power semiconductor devices.

Turning now to the drawings, FIG. 1 illustrates a cross-sectional view of a device 100, such as a singulated semiconductor device 100, an insulated gate field effect transistor (IGFET) 100, MOSFET 100, power semiconductor device 100, or switching device 100 in accordance with a first embodiment. Device 100 includes a singulated body of semiconductor material 11, body of semiconductor material 11, or singulated semiconductor substrate 11, which in one embodiment is formed from a semiconductor wafer that has been singulated along singulation lines to provide singulated edges 110. Further description of an example singulation process operation will be provided later.

Singulated body of semiconductor material 11 includes a first major surface 12 and a second major surface 13 opposite to first major surface 12. Second major surface 13 includes a recessed surface portion 16 defining a portion 131 of second major surface 13. Recessed surface portion 16 is bounded by opposing sidewall portions 14 extending outward from portion 131 of region of semiconductor material 11 in cross-sectional view. In one embodiment, sidewall portions 14 define portions 132 of second major surface 13. Portions 132 can also be referred to as tip portions 132 of sidewall portions 14, which are distal to portion 131 of second major surface 13. Stated another way, portions 132 of second major surface 13 and portion 131 of second major surface 13 lie on or within different planes. In accordance with the present embodiment, sidewall portions 14 include inner sidewall surfaces 141 or inner surfaces 141 and outer sidewall surfaces 142 or outer surfaces 142 opposite to inner surfaces 141. In accordance with the present embodiment, outer surfaces 142 are defined by singulated edges 110 after device 100 is singulated from a semiconductor wafer.

Device 100 further includes active device regions 21, which are disposed adjacent first major surface 12 of singulated region of semiconductor material 11. In one embodiment, active regions 21 can include a plurality of N-type conductivity regions and a plurality of P-type conductivity regions configured to form power semiconductor device structures, such as insulated gate field effect transistor (IGFET) devices, metal-oxide semiconductor field effect transistors (MOSFET) devices, insulated gate bipolar transistor (IGBT) devices, and other similar power semiconductor devices as known to those skilled in the art. The individual N-type regions and P-type regions are not illustrated in FIG. 1 so as to simplify the description of the present embodiment. By way of example, a MOSFET embodiment is described in more detail in FIG. 3.

In one embodiment, a layer of material 26 is disposed adjacent first major surface 12. In some embodiments, layer of material 26 can be one or more dielectric layers or materials configured to provide isolation and passivation of the active regions 21. In one embodiment, layer of material 26 can be an oxide, a nitride, combinations thereof, or other similar materials as known to those skilled in the art. Layer of material 26 can have openings 29, holes 29, or vias 29 (shown with dashed lines) to provide electrical communication between active regions 21 and conductive layers 27 disposed over layer of material 26. In one embodiment, conductive layers 27 can be under-bump metals or materials when conductive solder structures 31 or solder bumps 31 are used with device 100. By way of example, conductive layers 27 can be Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, or similar materials as known to those skilled in the art. In some embodiments, conductive solder structures 31 comprise Sn/Pb solder bumps, lead-free solder bumps, or other reflowable solder bump or ball materials as known to those skilled in the art. It is understood that in some embodiments, one or more masking layers or dielectric layers (not shown) can be included over portions of conductive layers 27 with openings provided for conductive solder structures 31 or other conductive connective structures.

In accordance with the present embodiment, device 100 further includes a conductive layer or layers 19 disposed or affixed adjacent or along portion 131 of second major surface 13. In some embodiments, conductive layer 19 comprises one or more conductive materials deposited or formed using sputtering, evaporation, plating, printing, deposition, dispensing, lift-off, combinations thereof, or other formation techniques as known to those skilled in the art. By way of example, conductive layer 19 can be a metal material, a conductive epoxy material, a solder material, a stencil material, combinations thereof, or other similar materials as known to those skilled in the art. In one embodiment, conductive layer 19 comprises an electroless plated material, such as electroless nickel.

In one preferred embodiment, which will be described further later, conductive layer 19 comprises a solder fill material formed using a screen printing process with sidewall portions 14 beneficially configured as or providing a screen structure or stencil structure during the formation process. In one embodiment, conductive layer 19 can be disposed along only portion 131 of second major surface 13.

In other embodiments, additional portions 191 of conductive layer 19 can be disposed along inner surfaces 141 of sidewall portions 14 as generally illustrated in FIG. 1. In further embodiments, conductive layer 19 can be configured to fill the recessed region 23 formed by portion 131 of second major surface 13 and sidewall portions 14 such that conductive layer 19 is substantially planar with portions 132 of second major surface 13. In other embodiments, conductive layer 19 can extend above portions 132 of second major surface 13.

As illustrated in FIG. 1, conductive layer 19 can be recessed (at least in part) below portions 132 of second major surface 13. In accordance with the present embodiment, portions 132 or tip portions 132 are substantially devoid of conductive layer 19. In other embodiments, as illustrated for example, in FIG. 2, conductive layer 19 can extend to overlap tip portions 132. In accordance with the present embodiment, conductive layer 19 can have a thickness greater than or equal to about 1.0 micron.

In one embodiment, active regions 21 are configured as a pair of laterally separated MOSFET devices 101 and 102, each MOSFET device having a gate electrode (e.g., one of conductive layers 27) and a source electrode (e.g., another one of conductive layers 27) adjacent first major surface 12. Also, in this configuration first conductive layer 19 comprises a common drain electrode for the pair of laterally separated MOSFET devices 101 and 102.

In accordance with the present embodiment, recessed portion 23 defined by recessed surface portion 16 and sidewall portions 14 provides an improvement in electrical performance by reducing the series resistance of body of semiconductor material 11 proximate to active regions 21. This improves, for example, Rdson performance. Also, sidewall portions 14 provide for a more stable semiconductor device that is less susceptible to stress issues, such as warpage and/or breakage during manufacturing and during use. Stated another way, sidewall portions 14 improve the strength of semiconductor device 100 while semiconductor device 100 has improved electrical performance because of recessed portion 23. This is an improvement over related devices that use global wafer thinning, which is a process incapable of achieving a desired final thickness because of warpage and breakage, and that do not have the same improvement in electrical performance compared to the present embodiment as a result of this thickness limitation. Additionally, semiconductor device 100 in accordance with the present embodiment can be fabricated using thicker back metal layers (i.e., greater than about 1.0 micron) with reduced susceptibility to warpage.

Figure 2:
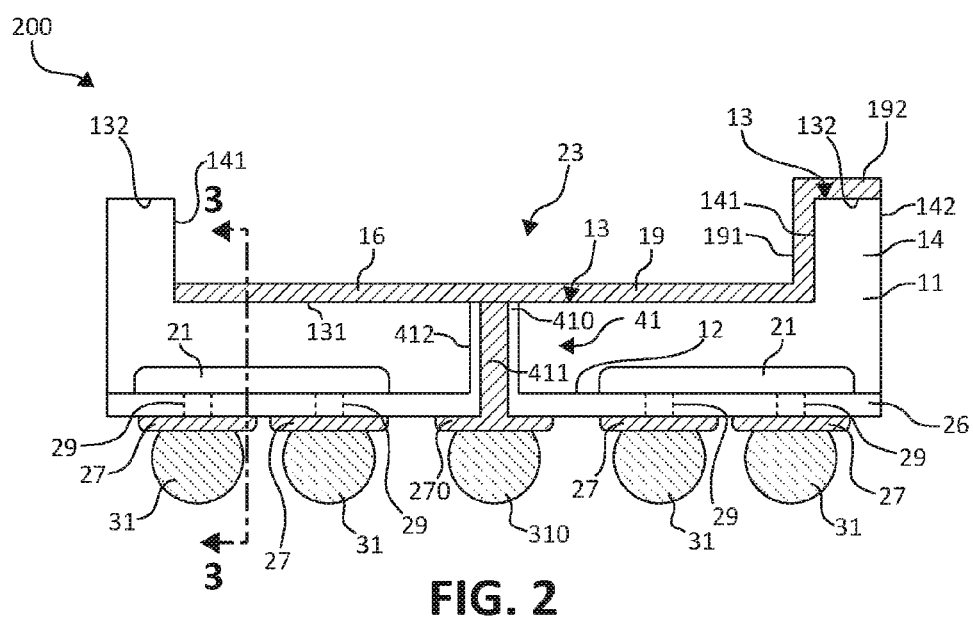
FIG. 2 illustrates an enlarged cross-sectional view of a singulated semiconductor device in accordance with an embodiment of the present invention.

FIG. 2 illustrates an enlarged cross-sectional view of a device 200, such as a singulated semiconductor device 200, an insulated gate field effect transistor (IGFET) 200, MOSFET 200, power semiconductor device 200, or switching device 200 in accordance with another embodiment. Device 200 is similar to device 100 and only the differences between the two devices will be described hereinafter. In accordance with the present embodiment, device 200 includes at least one through-substrate via 41, conductive via 41, TSV 41, or through-substrate contact 41. It is understood that multiple conductive vias 41 can be used. In one embodiment, conductive via 41 comprises trench 412 disposed in body of semiconductor material 11 and extending from first major surface 12 to portion 131 of second major surface 13. In one embodiment, conductive via 41 is lined with one or more insulating layers 410 disposed along sidewall portions of trench 412. A conductive material 411 is disposed within trench 412 adjacent to insulating layer(s) 410. In one embodiment, insulating layer 410 comprises an oxide material and conductive material 411 comprises a doped polycrystalline semiconductor material.

In one embodiment, trench 412 is formed using masking and etching techniques. By way of example, a dry etching process can be used with a fluorinated carbon chemistry as an etchant material when body of semiconductor material 11 is silicon. Also, insulating layer 410 can be formed using thermal growth, low-pressure deposition, or plasma-enhanced low-temperature deposition techniques. Conductive material 411 can be formed using low-pressure deposition or plasma-enhanced low-temperature deposition techniques. In accordance with the present embodiment, a conductive layer 270 is disposed over layer of material 26 and conductive layer 270 is electrically connected to conductive layer 19 through conductive via 41. In one embodiment, a conductive solder structure 310 is disposed adjacent conductive layer 270. In one embodiment, conductive layer 270 and conductive solder structure 310 are similar to conductive layers 27 and conductive solder structures 31 as described previously. In accordance with one embodiment, conductive via 41 and conductive layer 270 are configured to provide a structure for sensing the electrical characteristics of the common drain provided by conductive layer 19 in, for example, a flip-chip configuration.

FIG. 2 further illustrates alternative embodiments for conductive layer 19 including an embodiment where conductive layer 19 is absent from at least a portion of an inner surface 141 of sidewall portion 14 as illustrated on the left side of FIG. 2; and an embodiment where conductive layer 19 is further disposed over tip portions 132 of sidewall portion 14 as illustrated on the right side of FIG. 2. It is understood that any of the above described embodiments can be used with any of the device configurations described herein as determined, for example, by applicable or desired device specifications, requirements or characteristics.

Figure 3:
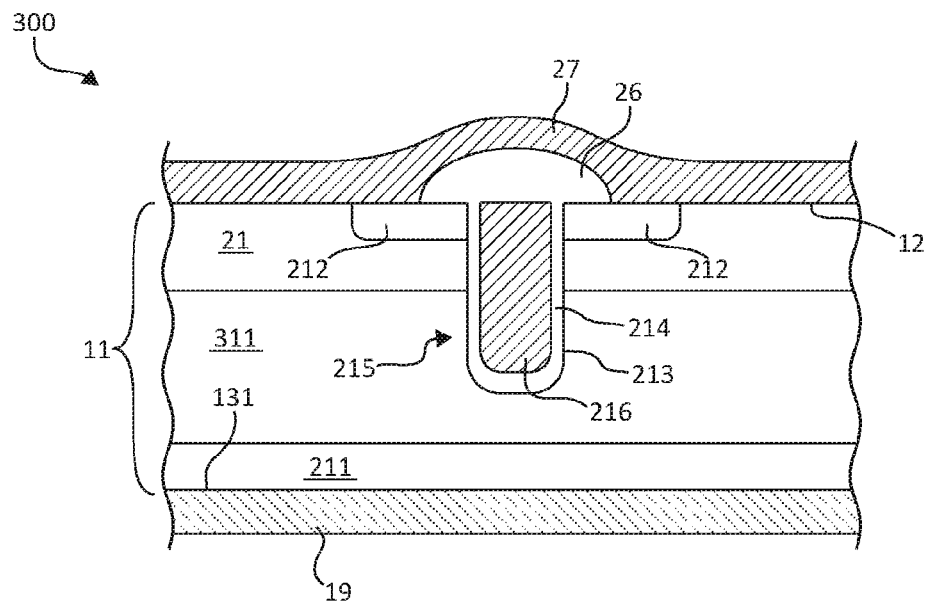
FIG. 3 illustrates an enlarged partial cross-sectional view of an insulated gate field effect transistor device taken along reference line 3-3 of FIG. 2 in accordance with an embodiment of the present invention.

FIG. 3 illustrates an enlarged partial cross-sectional view of an insulated gate field effect transistor (IGFET) device 300 or device 300 taken along reference line 3-3 of FIG. 2 with FIG. 3 being rotated 180 degrees from the orientation depicted in FIG. 2. Device 300 is an example of a power semiconductor device structure that can be used with devices 100 and 200. IGFET device 300 can be among many of such devices disposed adjacent to major surface 12 of device 100 or 200. In the present embodiment, body of semiconductor material 11 comprises a substrate 211, such as a heavily doped N-type substrate and a semiconductor layer 311, such as a lighter doped N-type semiconductor layer disposed between first major surface 12 and substrate 211. In the present embodiment, active region 21 is configured as a P-type doped region or body region for device 300. Active region 21 further includes N-type doped regions 212, which can be configured as source regions for device 300. IGFET device 300 further includes a trench control electrode structure 215, which includes a trench 213 extending from first major surface 12 into body of semiconductor material 11, a dielectric layer 214, and a conductive electrode 216 disposed adjacent to dielectric layer 214. Layer of material 26 isolates conductive electrode 216 from conductive layer 27, which in the embodiment illustrated comprises a current-carrying electrode or source electrode.

Figure 4:
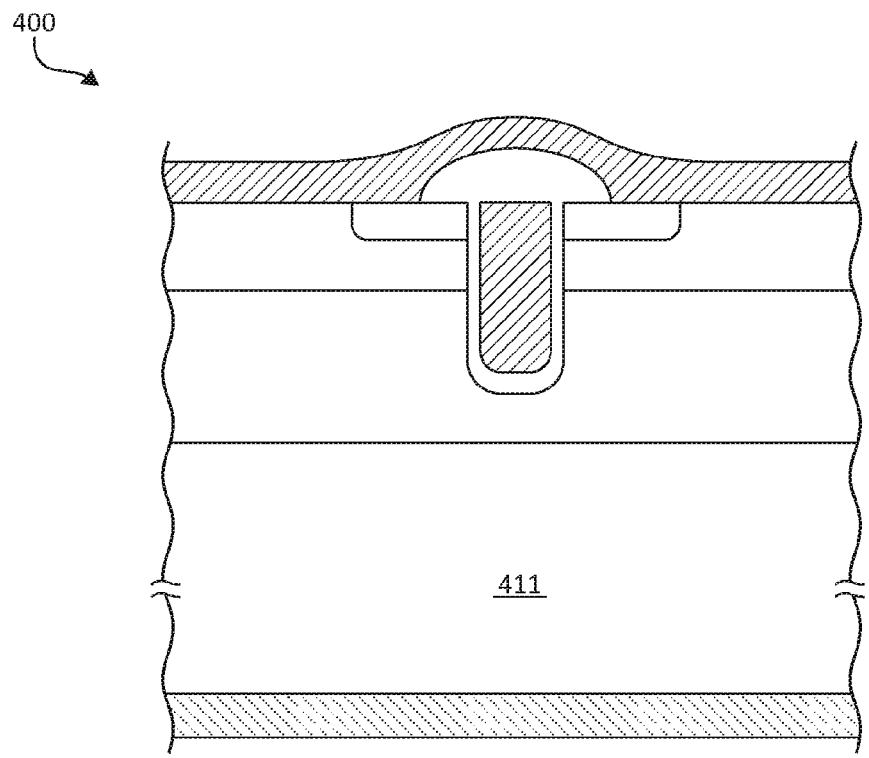
FIG. 4 shows an enlarged partial cross-sectional view of a related insulated gate field effect transistor device.

FIG. 4 illustrates an enlarged partial cross-sectional view of a related insulated gate field effect transistor device (IGFET) 400 as comparison to IGFET device 300. More particularly, IGFET device 400 uses a substrate 411, which is globally thinned using lapping or grinding techniques. Since IGFET device 400 uses global thinning processes, substrate 411 can be thinned to only a certain or limited amount because of semiconductor wafer warpage and/or breakage issues, which results in substrate 411 being substantially thicker than substrate 211. For example, substrate 411 is typically on the order of 75 microns through 100 microns thick while recessed substrate portion 211 is typically 25 microns through 50 microns thick. As a result, IGFET device 400 has a more series resistance and a higher Rdson compared to IGFET device 300, and cannot meet industry demands for improved system performance like devices 100, 200, and 300.

Turning now to FIGS. 5-11, a method of forming a plurality of singulated semiconductor devices, such as semiconductor devices 100 or 200 will be described. More particularly, FIGS. 5-11 illustrate partial cross-sectional views of a semiconductor wafer 500 having a plurality of semiconductor devices 501 at various stages of fabrication. So as to not crowd the figures, certain details of each semiconductor device 501 are not included in FIGS. 5-11. Such details are illustrated, for example, in FIGS. 1, 2, and 3.

FIG. 5 illustrates a partial cross-sectional view of semiconductor wafer 500 or semiconductor substrate 500 at an intermediate stage of fabrication. In one embodiment, semiconductor wafer 500 comprises a silicon substrate and has a thickness in range from about 705 microns to about 745 microns for a 200 millimeter diameter substrate. In this embodiment, each of plurality of semiconductor devices 501 is separated by singulation lines 504 (represented by the vertically oriented dashed lines), which can be on the order of 5-20 microns wide when a plasma etch singulation process is used to separate each of the plurality of semiconductor devices 501 from semiconductor wafer 500. Otherwise singulation lines 504 can be 35 microns through 75 microns if laser or saw singulation processes are used. Semiconductor wafer 500 includes a first major surface 512 and a second major surface 513A opposite to first major surface 512. In one embodiment, a patterned conductive layer 527 is disposed adjacent to first major surface, which can be separated in part from first major surface 512 by a dielectric layer or layers (not shown).

FIG. 6 illustrates a partial cross-sectional view of semiconductor wafer 500 after additional processing. In one embodiment, a portion of semiconductor wafer 500 is globally removed extending inward from original second major surface 513A to provide second major surface 513B. In one embodiment, a global removing process, such grinding, lapping, and/or etching can be used to remove a portion of semiconductor wafer 500 to provide second major surface 513B. In one embodiment, the thickness of semiconductor wafer 500 after the global removal process typically is in a range from about 75 microns through about 150 microns.

FIG. 7 illustrates a partial cross-sectional view of semiconductor wafer 500 after further processing. In one embodiment, semiconductor wafer 500 can be flipped or rotated such that first major surface 512 is oriented downward and second major surface 513B is oriented upward for further processing. In one embodiment, a masking layer 521 or masking structure 521 is provided adjacent to second major surface 513B. Masking layer 521 is configured with a plurality of openings 522 that extend through or at least partially through masking layer 521 in a preselected pattern to expose portions of second major surface 513B. In accordance with the present embodiments, openings 522 can have a variety of shapes including, for example, square shapes, rectangular shapes, polygonal shapes, round shapes, and random shapes. Moreover, the placement of openings 522 can be substantially centrally aligned to each semiconductor device 501, or the placement can be offset towards one or more sides of each semiconductor device 501.

In one embodiment, masking layer 521 comprises a polymer layer, such as a photoresist layer or a polyimide layer. In another embodiment, masking layer 521 comprises a dielectric material, such as an oxide, or a conductive material, such as a metal. In accordance with the present embodiment, masking layer 521 is configured such that portions of masking layer 521 overlap or cover singulation lines 504 as well as portions of semiconductor devices 501 adjoining singulation lines 504. In accordance with the present embodiment, those portions semiconductor devices 501 covered by masking layer 521 correspond, at least in part, to sidewall portions 5141 (illustrated in FIG. 8) for each semiconductor device 501, which will be formed in a subsequent operation of the present method.

Figure 8:
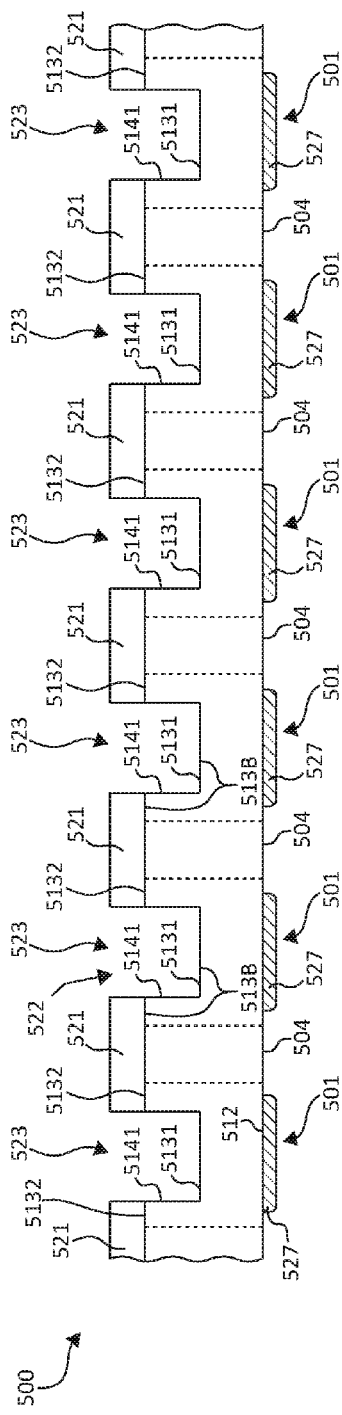

FIG. 8 illustrates a partial cross-sectional view of semiconductor wafer 500 after still further processing. In accordance with the present embodiment, portions of semiconductor wafer 500 exposed through opening 522 of masking layer 521 are removed to provide recessed portions 523 or keyed portions 523, which have a shape similar to openings 522. In accordance with the present embodiment, recessed portions 523 are defined by portion 5131 of second major surface 513B and sidewall portions 5141, which extend between portion 5131 and another portion 5132 of second major surface 513B. In some embodiments, recessed portions 523 are formed using plasma etching techniques and using a chemistry that selectively etches silicon at a much higher rate than that of dielectrics and/or other masking materials. In one embodiment, semiconductor wafer 500 can be etched using a process commonly referred to as the Bosch process. In other embodiments, wet chemical etching is used to form recessed portions 523. By way of example, sidewall portions 5141 can have a height (i.e., distance between portions 5132 and 5131) in a range from about 50 microns through about 100 microns. In another embodiment, conductive vias 41 can be formed or provided at this stage of fabrication. Also, it is understood that conductive layer 527 can be provided as well at this stage of fabrication instead of earlier in the fabrication process. It is understood that sidewall portions 5141 can be provided on one, two, three, or four sides of one or more of semiconductor devices 501 using a desired and preselected masking scheme to provide masking layer 521.

Figure 9:
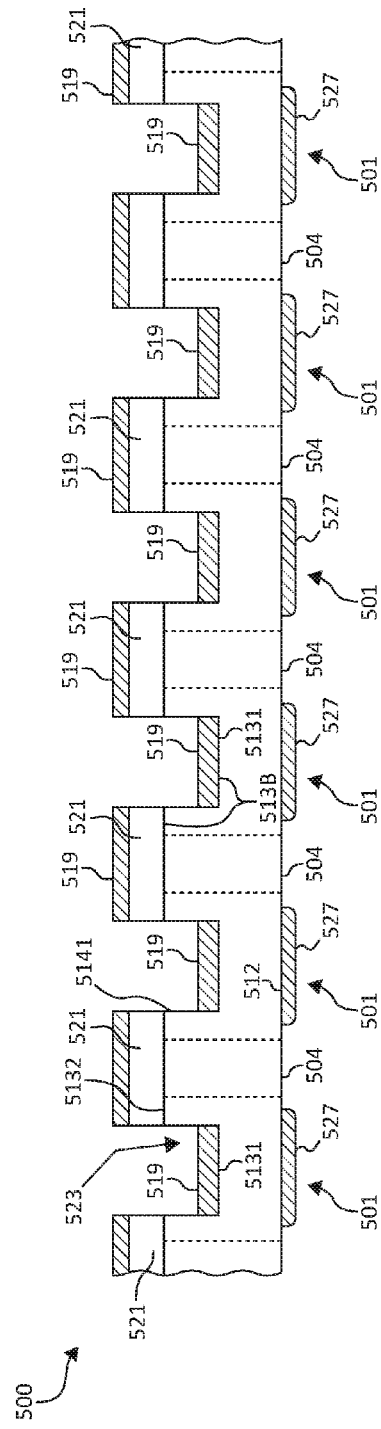

FIG. 9 illustrates a partial cross-sectional view of semiconductor wafer 500 after additional processing. In one embodiment, conductive layer 519 is provided disposed adjacent or along portion 5131 of second major surface 513B and disposed adjacent masking layer 521. In one embodiment, a directional deposition process, such as physical deposition process (for example, evaporation) can be used to form conductive layer 519. In one embodiment, conductive layer 519 can have a thickness greater than about 1.0 micron and can be a metal, such as Cu/Ni, Cu/Ni/Au, Ti/Ni/Au, Ti/Ni/Ag, Ti/Ni/Ag/Sn, Cr/Ni/Au, Cr/Ni/Ag, or other similar conductive materials as known to those skilled in the art. In other embodiments, masking layer 521 can be removed before forming conductive layer 519, and then conductive layer 519 can then be patterned using, for example, photolithographic and etch techniques. In some embodiments, electrochemical deposition processes, such as plating processes can be used to form first conductive layer 519. Such processes include, for example, electroless plating and electroplating processes. In other embodiments, combinations of deposition techniques can be used to form conductive layer 519. It is understood that the photolithographic and etch techniques can be used to leave at least portions of conductive layer 519 adjoining or affixed to sidewall portions 5141 and/or portions 5132 of second major surface 513B. In other embodiments, masking layer 521 is removed after forming recessed portions 523 and conductive layer 519 is formed as a blanket layer disposed adjacent to all surfaces of second major surface 513B, including, for example, sidewall portions 5141 and portions 5131 and 5132. In some embodiments, conductive layer is formed to be affixed to all surfaces of second major surface 513B.

FIG. 10 illustrates a partial cross-sectional view of semiconductor wafer 500 after further processing. In one embodiment, a lift-off process is used to remove masking layer 521, which also removes that portion of conductive layer 519 disposed adjacent to masking layer 521. In one embodiment, a solvent is used configured to dissolve masking layer 521, but not damage semiconductor wafer 500 including conductive layer 519 disposed adjacent portions 5131 of second major surface 513B.

FIG. 11 illustrates a partial cross-sectional view of semiconductor wafer 500 after still further processing. In one embodiment, semiconductor wafer 500 is attached to a carrier substrate 561, such as a carrier tape attached to a supporting frame (not shown). More particularly, in one embodiment, portions 5132 of second major surface 513B are placed or affixed to carrier substrate 561 as generally illustrated in FIG. 11. In one preferred embodiment, semiconductor wafer 500 and carrier substrate 561 are placed within a plasma etching chamber and plasma etching is used to remove portions of semiconductor wafer 500 in singulation lines 504 to provide a plurality of singulated semiconductor devices 501. In some embodiments, a protective masking layer 563 can be formed overlying at least portions of first major surface 512 with openings formed proximate to singulation lines 504 before etching semiconductor wafer 500. Protective masking layer 563 can be a polymer layer, a dielectric layer, or other suitable protective materials as known to those skilled in the art.

The etching process can be performed using a chemistry that selectively etches silicon at a much higher rate than that of polymers, dielectrics and/or metals. In one embodiment, semiconductor wafer 500 can be etched using the Bosch process. In one embodiment, semiconductor wafer 500 can be etched using the Bosch process in a deep reactive ion etch system. In one embodiment, the width of singulation lines 504 can be from about 5 microns to about 20 microns. Such a width is sufficient to ensure that the openings that form singulation lines 504 can be formed completely through semiconductor wafer 500 as generally illustrated in FIG. 11. In one embodiment, singulation lines 504 can be formed in about 5 to about 30 minutes using the Bosch process. A suitable etch apparatus is available from Plasma-Therm of St. Petersburg, Fla., U.S.A. In further steps, plurality of singulated semiconductor devices 501 can be removed from carrier substrate 561 and assembled into package structures in accordance with specific application requirements. In other embodiments, laser and/or saw singulation methods can be used with singulation lines 504 being wider—for example, 35 microns through 75 microns wide.

Figure 12:
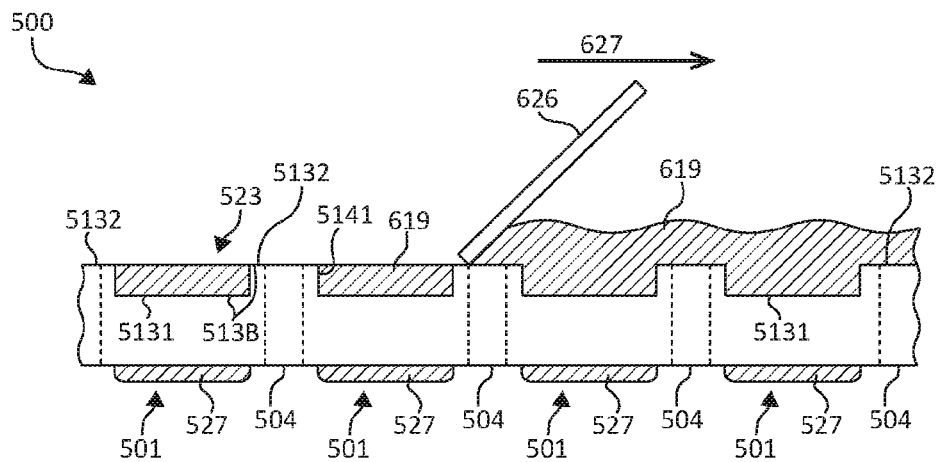
FIG. 12 illustrates a partial cross-sectional view of a semiconductor wafer having a plurality of semiconductor devices at a step of fabrication in accordance with an embodiment of the present invention.

FIG. 12 illustrates a partial cross-sectional view of semiconductor wafer 500 having a plurality of semiconductor devices 501 at a step of fabrication in accordance with an alternative embodiment. In one embodiment, semiconductor wafer 500 is processed in accordance with the steps described previously in FIGS. 5-8. In the present embodiment, after recessed portions 523 are formed, masking layer 521 (illustrated in FIG. 8) can be removed from portions 5132 of second major surface 513B. Next, a conductive material 619 is then dispensed over second major surface 513B such that conductive material 619 overfills recessed portions 523 and overlaps onto portions 5132 of second major surface 513B. Conductive material 619 is preferably a fluid dispensable material, such as a solder paste material, a conductive epoxy material, or other similar materials as known to those skilled in the art. Next, in one embodiment, a blade-like structure 626 is moved laterally across (as represented by arrow 627) second major surface 513B to remove excess conductive material 619. In one embodiment, this removal step removes substantially all of conductive material 619 from portions 5132 of second major surface 513B as generally illustrated in FIG. 12. In accordance with the present embodiment, sidewall portions 5141 are conveniently configured as screening structures to assist in the selective removal of portions conductive material 619 while leaving other portions of conductive material 619 remaining within recessed portions 523. After the removal step, conductive material 619 can be cured or annealed according to specification requirements or characteristics of the conductive material used. In other embodiments, a non-conductive layer (not shown) can be included and disposed overlying conductive material 619 for protection and to facilitate marking. By way of example, materials suitable for the non-conductive layer include epoxies or other liquid encapsulants. Semiconductor wafer 500 can then be separated into individual singulated semiconductor devices 501 as described previously.

Figure 13:
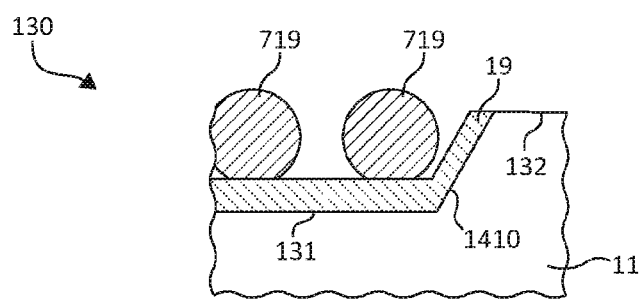
FIG. 13 illustrates a partial cross-sectional view of a singulated semiconductor device in accordance with an embodiment of the present invention.

FIG. 13 illustrates a partial cross-sectional view of a singulated semiconductor device 130 in accordance with another embodiment. It is understood that FIG. 13 only illustrates the portion of semiconductor device 130 proximate to second major surface portions 131 and 132, and that first major surface of semiconductor device 130 can be as illustrated in any of the embodiments disclosed herein. Device 130 is similar to devices 100 and 200 and only the differences will be described hereinafter. In one embodiment, sidewall portion 1410 is provided with a sloped profile or sloped shape in cross-sectional view. Also, in some embodiments one or more conductive solder structures 719 can be provided adjoining or affixed to first conductive layer 19. In one embodiment, conductive solder structures 719 can be solder balls formed using a ball drop process. In some embodiments, distal surfaces of conductive solder structures 719 extend above tip portion 132 as generally illustrated in FIG. 13. In accordance with the present embodiment, conductive solder structures can be used to electrically connect semiconductor devices 100 and 200 to other semiconductor devices, to interposer structures, to printed circuit boards, or to other structures as known to those skilled in the art. It is understood that conductive solder structures 719 can be used with any of the embodiments described herein.

Figure 14:
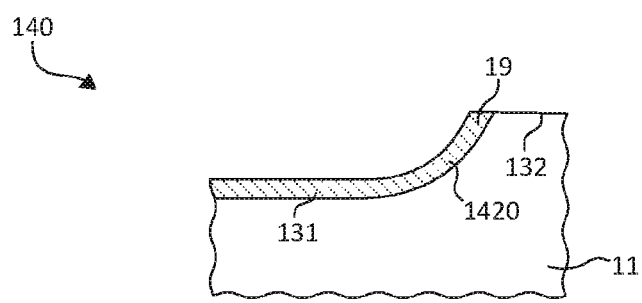
FIG. 14 illustrates a partial cross-sectional view of a singulated semiconductor device in accordance with an embodiment of the present invention.

FIG. 14 illustrates a partial cross-sectional view of a singulated semiconductor device 140 in accordance with another embodiment. It is understood that FIG. 14 only illustrates the portion of semiconductor device 140 proximate to second major surface portions 131 and 132, and that first major surface of semiconductor device 140 can be as illustrated in any of the embodiments disclosed herein. Device 140 is similar to devices 100 and 200 and only the differences will be described hereinafter. In one embodiment, sidewall portion 1420 is provided with a curved profile or curved shape in cross-sectional view. It is understood that conductive solder structures 719, as illustrated in FIG. 12, can also be used with semiconductor device 140.

In view of all of the above, it is evident that a novel method and structure is disclosed. Included, among other features, a singulated semiconductor device having a recessed major surface opposite to active major surface where device regions are provided. The recessed major surface includes a recessed surface bounded by sidewall portions. A conductive layer is disposed adjacent at least the recessed surface. The recessed surface improves the electrical performance of the singulated semiconductor device and the sidewall portions strengthen the semiconductor during manufacturing thereby reducing breakage and/or warpage even when thicker back metal layers are used. The structure and method significantly improve device electrical performance and improve manufacturing yields.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, planar gate structure can be used in addition to or in place of trench gate structures. Also, other semiconductor materials in addition to or instead of silicon can be used.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A semiconductor device comprising:
    a singulated region of semiconductor material having a first major surface and a second major surface opposite to the first major surface, the second major surface comprising a recessed surface portion bounded by sidewall portions extending outward from the singulated region of semiconductor material, the sidewall portions having outer surfaces defining peripheral edge segments for each edge of the singulated region of semiconductor material, the sidewall portions further comprising inner surfaces opposite to the outer surfaces, the sidewall portions further comprising tip portions distal to the recessed surface portion such that the tip portions lie on a first horizontal plane and the recessed surface portion lies on a second horizontal plane different than the first horizontal plane; and
    an active device region disposed adjacent to the first major surface, wherein the recessed surface portion laterally extends to each peripheral edge segment without extending to the first horizontal plane and laterally overlaps the active device region.

2. The semiconductor device of claim 1 further comprising a first conductive layer disposed adjacent the recessed surface portion.

3. The semiconductor device of claim 2, wherein:
    the active device region comprises a pair of laterally separated MOSFET devices, each MOSFET device having a gate electrode and a source electrode adjacent the first major surface; and the first conductive layer comprises a common drain electrode for the pair of laterally separated MOSFET devices.

4. The semiconductor device of claim 2, wherein:
the tip portions are devoid of the first conductive layer.

5. The semiconductor device of claim 2 further comprising a conductive via extending from the recessed surface portion to the first major surface to electrically couple the first conductive layer to the first major surface, wherein the conductive via comprises:
a trench having sidewall surfaces;
an insulating layer disposed adjacent the sidewall surfaces; and
a conductive material disposed adjacent the insulating layer, wherein the conductive material and the first conductive layer comprise different materials.

6. The semiconductor device of claim 5 further comprising a conductive solder structure disposed adjacent the first major surface and electrically coupled to the first conductive layer through the conductive via, wherein the conductive solder structure is configured to directly attach the semiconductor device to a next level of assembly in a flip-chip configuration.

7. The semiconductor device of claim 2, wherein the first conductive layer is disposed adjoining the inner surfaces of the sidewall portions but is not disposed on the tip portions.

8. The semiconductor device of claim 1 further comprising conductive solder structures disposed adjacent the first major surface and electrically coupled to the active device region, wherein the conductive solder structures are configured to directly attach the semiconductor device to a next level of assembly in a flip-chip configuration.

9. The semiconductor device of claim 1, wherein the semiconductor device further comprises a plurality of solder balls disposed within the recessed surface portion, and wherein each of the plurality of solder balls has an end distal to the recessed surface portion that extends outward beyond the first horizontal plane.

10. A method of manufacturing a semiconductor device comprising:
providing a semiconductor substrate having first and second opposing major surfaces, a pair of laterally separated semiconductor devices formed as part of the semiconductor substrate adjacent the first major surface;
forming a recessed surface portion extending inward from the second major surface, the recessed surface portion disposed adjacent the pair of laterally separated semiconductor devices, the recessed surface portion being bounded by sidewall portions extending outward from the recessed surface portion, the sidewall portions having tip portions distal to the recessed surface portion, wherein the tip portions lie on a first plane;
providing a first conductive layer within the recessed surface portion; and
singulating the semiconductor substrate through the sidewall portions to provide a singulated semiconductor device such that the sidewall portions define peripheral edge segments for each edge of the singulated semiconductor device, wherein:
the recessed surface portion laterally extends to all sidewall portions and to each peripheral edge segments without extending to the first plane; and
the recessed surface portion laterally overlaps the pair of laterally separated semiconductor devices.

11. The method of claim 10, wherein forming the recessed surface portion comprises:
forming a masking layer over the second major surface, the masking layer having an opening corresponding to a location of the recessed surface portion; and
etching through the opening into the semiconductor substrate to provide the recessed surface portion.

12. The method of claim 11, wherein providing the first conductive layer comprises:
depositing the first conductive layer over the masking layer and within the recessed surface portion; and
thereafter removing the masking layer wherein removing the masking layer also removes those portions of the first conductive layer disposed over the masking layer leaving the first conductive layer within the recessed surface portion.

13. The method of claim 10, wherein providing the first conductive layer comprises using a screen printing process comprising:
providing the first conductive layer overlying the recessed surface portion and the sidewall portions; and
using the sidewall portions as a screen for the screen printing process thereby leaving the first conductive layer within the recessed surface portion, and wherein the tip portions of the sidewall portions are substantially devoid of the first conductive portion after the screen printing process.

14. The method of claim 10 further comprising placing the semiconductor substrate onto a carrier substrate, wherein:
singulating the semiconductor wafer comprises plasma etching through the sidewall portions to provide the singulated semiconductor device while the semiconductor substrate is on the carrier substrate.

15. The method of claim 10, wherein:
providing the pair of laterally separated semiconductor devices comprises providing a pair of laterally separated MOSFET devices; and
providing the first conductive layer comprises providing a common drain within the recessed surface portion for the pair of laterally separated MOSFET devices; and
the method further comprises providing a conductive via extending from the recessed surface portion to the first major surface and laterally interposed between the pair of laterally separated MOSFET devices, the conductive via comprising:
a trench having sidewall surfaces;
an insulating layer disposed adjacent the sidewall surfaces; and
a conductive material disposed adjacent the insulating layer, wherein the conductive material and the first conductive layer comprise different materials.

16. A method of manufacturing a semiconductor device comprising:
providing a semiconductor substrate having first and second opposing major surfaces and a pair of laterally separated power semiconductor devices formed as part of the semiconductor substrate adjacent the first major surface;
forming a recessed surface portion extending inward from the second major surface, the recessed surface portion disposed adjacent the pair of laterally separated power semiconductor devices, the recessed surface portion being bounded by sidewall portions extending outward from the recessed surface portion and having tip portions distal to the recessed surface portion;
providing a first conductive layer within the recessed surface portion;

placing the semiconductor substrate adjacent a carrier substrate; and plasma etching the semiconductor substrate from the first major surface through the sidewall portions to provide a singulated power semiconductor device comprising the pair of laterally separated power semiconductor devices, wherein:

the tip portions lie on a first plane;

the recessed surface portion lies on a second plane different than the first plane;

the sidewall portions of the singulated power semiconductor device are disposed along each peripheral edge of the singulated power semiconductor device and define an outer perimeter for the pair of laterally separated power semiconductor devices; and the recessed surface portion laterally extends to the outer perimeter defined by the sidewall portions without extending to the first plane and laterally overlaps the pair of laterally separated power semiconductor devices.

17. The method of claim 16, wherein:

providing the pair of laterally separated power semiconductor devices comprises providing pair of laterally separated MOSFET devices; and the method further comprises:

providing a through-semiconductor conductive via extending from the recessed surface portion to the first major surface and laterally interposed between the pair of laterally separated MOSFET devices, wherein the through-semiconductor conductive via comprises:

a trench having sidewall surfaces;

an insulating layer disposed adjacent the sidewall surfaces; and a conductive material disposed adjacent the insulating layer, wherein the conductive material and the first conductive layer comprise different materials; and providing a conductive solder structure adjacent the first major surface and electrically coupled to the first conductive layer by the through-semiconductor conductive via, wherein:

the recessed surface portion is configured to reduce series resistance of the semiconductor substrate for each MOSFET device.

18. The method of claim 16, wherein forming the recessed surface portion comprises:

forming a masking layer over the second major surface, the masking layer having an opening corresponding to the recessed surface portion; and etching through the opening into the semiconductor substrate to form the recessed surface portion.

19. The method of claim 18, wherein providing the first conductive layer comprises:

depositing the first conductive layer over the masking layer and within the recessed surface portion; and thereafter removing the masking layer wherein removing the masking layer also removes those portions of the first conductive layer disposed over the masking layer leaving the first conductive layer within the recessed surface portion.

20. The method of claim 16, wherein:

providing the first conductive layer comprises providing the first conductive layer over inner sidewall surfaces but not the tip portions; and the method further comprises providing a conductive solder structure disposed adjoining the first conductive layer within the recessed surface portion.

* * * * *